US005949528A

United States Patent [19]

Iwasaki

[11] Patent Number: 5,949,528

[45] Date of Patent: Sep. 7, 1999

[54] IMAGE FORMING APPARATUS

[75] Inventor: Takeo Iwasaki, Nagoya, Japan

[73] Assignee: Brother Kogyo Kabushiki Kaisha, Nagoya, Japan

[21] Appl. No.: 09/004,098

[22] Filed: Jan. 7, 1998

[30] Foreign Application Priority Data

Jan. 8, 1997 [JP] Japan .................................... 9-001294

[51] Int. Cl.$^{6}$ ........................... G03B 27/00; G03B 27/32; G03B 27/54

[52] U.S. Cl. .............................. 355/402; 355/27; 355/37; 355/67

[58] Field of Search ............................... 355/27, 37, 400, 355/402, 41, 67, 70, 71; 358/302

[56] References Cited

U.S. PATENT DOCUMENTS 4,399,209 8/1983 Sanders et al. .
4,440,846 4/1984 Sanders et al. .
4,992,822 2/1991 Yamamoto et al. .
5,028,963 7/1991 Ohashi et al. ............................ 355/27
5,070,411 12/1991 Suzuki ...................................... 355/37
5,822,039 10/1998 Nishida et al. ........................... 355/27

FOREIGN PATENT DOCUMENTS

A-62-161153 7/1987 Japan .
A-62-231758 10/1987 Japan .
A-63-31364 2/1988 Japan .

*Primary Examiner*—Safet Metjahic
*Assistant Examiner*—Peter Kim
*Attorney, Agent, or Firm*—Oliff & Berridge, PLC

[57] ABSTRACT

An image forming apparatus for forming an image by exposing and developing the photosensitive record medium, the photosensitive record medium having a first microcapsule whose strength is changed by being emitted a blue light, a second microcapsule whose strength is changed by being emitted a green light, and a third microcapsule whose strength is changed by being emitted a red light, the image forming apparatus comprising: an exposing device on which a first light emitting device for emitting the blue light, a second light emitting device for emitting the green light and a third light emitting device for emitting the red light are mounted, for exposing the photosensitive record medium by the blue light, the green light and the red light; a developing device for developing the exposed photosensitive record medium by applying a pressure to the exposed photosensitive record medium; and a transporting unit for transporting the photosensitive record medium from an exposing position where the exposing device is mounted to a developing position where the developing device is mounted, wherein, in the exposing device, the first light emitting device, the second emitting device and the third emitting device are arranged in a transport direction of the photosensitive record medium, the second light emitting device is positioned more distant from the developing position as compared with a position of the third light emitting device, and the first light emitting device is positioned more distant from the developing position as compared with a position of the second light emitting device.

14 Claims, 11 Drawing Sheets

20 X′ X Y X1 X1 9d 39 12 9c Y1 12 9b 12 9a 8d 39 8c Y1 8b 8a 7c Y1 7b 7a 80
75
82a
82b
484
486
46
45
64b
49
48
60
481
483
47
63
20
66
63
64a
482
491
661
d
81
65
68
67
37
74

IMAGE FORMING APPARATUS

BACKGROUND OF THE INVENTION

1. Field of the Invention

The present invention relates to an image forming apparatus for forming an image on the photosensitive record medium by exposure and development, and more specifically relates to an image forming apparatus having plural light emitting elements for emitting an image forming lights corresponding an image at the time of exposure.

2. Description of the Related Art

U.S. Pat. Nos. 4,440,846 and 4,399,209 describe an image forming system wherein an image is formed by exposing a photosensitive layer having a microcapsule containing, as an internal phase, a photosensitive composition, and by applying uniform pressure to rupture the microcapsule. More specifically, the photosensitive layer is exposed to light emission in the shape corresponding to an image. The mechanical strength of the microcapsule is changed by the light emission, and a latent image is formed on the photosensitive layer. Then, the rupturing force is applied to the photosensitive layer. Therefore, the microcapsule whose mechanical strength is reduced by the light emission is ruptured, and a coloring material (chromogenic material or color coupler) encapsulated in the microcapsule is flowed out. Therefore, the flowed coloring material reacts with a developer, and an image is formed.

A variety of the image forming apparatus wherein a photosensitive record medium is exposed by emitting a light corresponding to image information thereto and it is developed are known. For example, a Japanese patent application laid open, No. Sho 62-231758 describes an image forming apparatus wherein an image is formed by emitting a light supplied from a white light source onto the photosensitive record medium in accordance with printing patterns. A Japanese patent application laid open, No. Sho 63-31364 describes an image forming apparatus wherein an image is formed by emitting plural color light onto the photosensitive record medium. U.S. Pat. No. 4,992,822 describes an image forming apparatus wherein an image is formed by emitting repeatedly a light to the same portion of a photosensitive record medium, which is capable of generating plural colors, by using a polygon mirror or the like.

However, in each of the aforementioned image forming apparatus, a required quality of an image cannot be obtained, and it is required to simplify a construction of the image forming apparatus.

SUMMARY OF THE INVENTION

It is therefore an object of the present invention to provide an image forming apparatus which can improve a quality of an image formed on the photosensitive record material, and simplify a construction thereof.

According to the present invention, the above mentioned object can be achieved by an image forming apparatus for forming an image on a photosensitive record medium by exposing and developing the photosensitive record medium, the photosensitive record medium having, at least, a first microcapsule including a first photosensitive component whose strength is changed by being emitted a first light having a first wavelength and a first coloring material, and a second microcapsule including a second photosensitive component whose strength is changed by being emitted a second light having a second wavelength and a second coloring material, the first wavelength being shorter than the second wavelength, the image forming apparatus having: an exposing device on which at least a first light emitting device for emitting the first light and a second light emitting device for emitting the second light are mounted, for exposing the photosensitive record medium by the first light and the second light; a developing device for developing the exposed photosensitive record medium by applying a pressure to the exposed photosensitive record medium; and a transporting unit for transporting the photosensitive record medium from an exposing position, where the exposing device is mounted, to a developing position, where the developing device is mounted, wherein, in the exposing device, the first light emitting device and the second emitting device are arranged in a transport direction which the photosensitive record medium is transported by the transporting unit, and the first light emitting device is positioned more distant from the developing position as compared with a position of the second light emitting device.

The photosensitive record medium is exposed by the exposing head. More specifically, the photosensitive record medium is exposed by the first light emitted from the first light emitting device and the second light emitted from the second light emitting device. When the photosensitive record medium is exposed by the first light, the strength of the first microcapsule positioned at the exposed part is changed. When the photosensitive record medium is exposed by the second light, the strength of the second microcapsule positioned at the exposed part is changed. Further, while this exposing operation is performed, the photosensitive record medium is transported by the transporting device. Thus, a whole exposing area of the photosensitive record medium is exposed, and a latent image is formed on the photosensitive record medium. Further, the exposed photosensitive record medium is transported from the exposing position to the developing position. At the developing position, the pressure is applied to the exposed photosensitive record medium by the developing device. Thereby, the microcapsule having a relatively weak strength is ruptured, and the coloring material included in the microcapsule is discharged. Thus, a visible image is formed on the photosensitive record medium.

As mentioned above, the strength of the microcapsule of the photosensitive record medium is changed by the light emitted from the light emitting device. This cause is that a reaction to change the strength of the photosensitive component is occurred when a light energy is applied to the microcapsule. Here, a rate (velocity) of the reaction is not so fast. Namely, the reaction slowly progresses after exposure. Therefore, a sensitivity of the photosensitive record medium is changed with a period between an end of exposure and a start of development. Namely, the sensitivity of the photosensitive record medium differs according to a length of the period between an end of exposure and a start of development. Further, the rate of the reactions to change the strength of the photosensitive component is different in accordance with color (wavelength) of the light emitting element.

Here, since the first wavelength is shorter than the second wavelength, the first microcapsule is slower than the second microcapsule in the rate of reaction to change the strength of the photosensitive component. For this reason, in order to perform sufficiently the reaction with respect to both of the first microcapsule and the second microcapsule, the reaction in the first microcapsule requires the long period compared with the reaction in the second microcapsule. Therefore, it is required that a period between an end of exposure and a start of development makes long with respect to the first microcapsule. In contrast, with respect to the second microcapsule, a period between an end of exposure and a start of development can be short because the reaction rate of the second microcapsule is relatively fast.

From this point of view, the first light emitting device is positioned more distant from the developing position as compared with a position of the second light emitting device. Namely, a distance between the first light emitting device and the developing position is longer than a distance between the second light emitting device and the developing position. Accordingly, with respect to the first microcapsule, the period between an end of exposure and a start of development is relatively long. Therefore, the reaction in the first microcapsule is sufficiently performed during such a long period even if the reaction rate of the first microcapsule is relatively slow. On the other hand, a distance between the second light emitting device and the developing position is shorter than a distance between the first light emitting device and the developing position. Accordingly, with respect to the second microcapsule, the period between an end of exposure and a start of development is relatively short. Therefore, the reaction in the second microcapsule is quickly performed during such a short period because the reaction rate of the second microcapsule is relatively fast.

Thus, since the reaction to change the strength of the photosensitive component is sufficiently performed with respect to both of the first microcapsule and the second microcapsule, the uniform optical density (light density) can be obtained.

The nature, utility, and further feature of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, embodiments of the present invention will be now explained.

Figure 1:
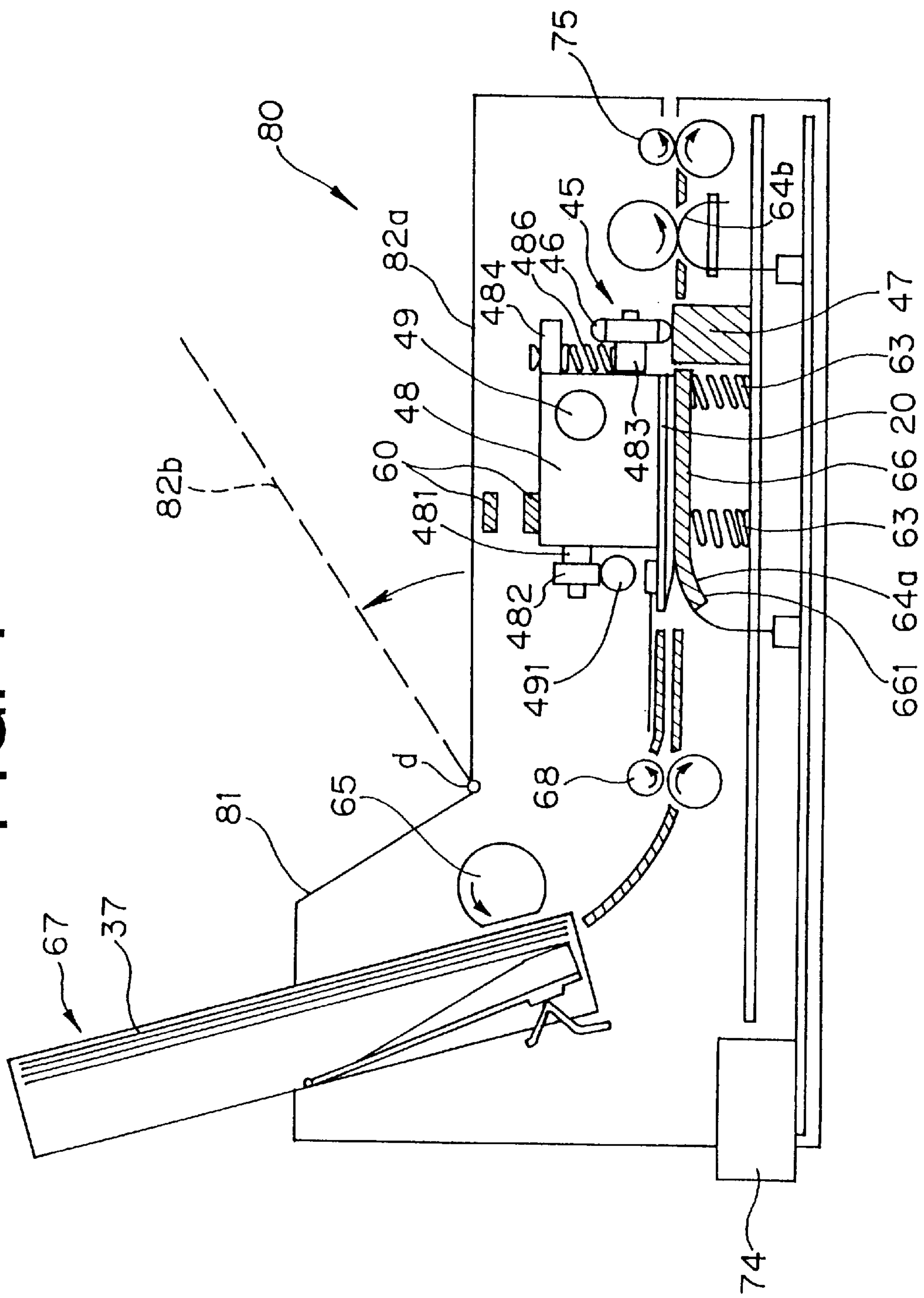
FIG. 1 is a sectional view of a printer of a photosensitive and pressure sensitive type according to an embodiment of the present invention.
Figure 2:
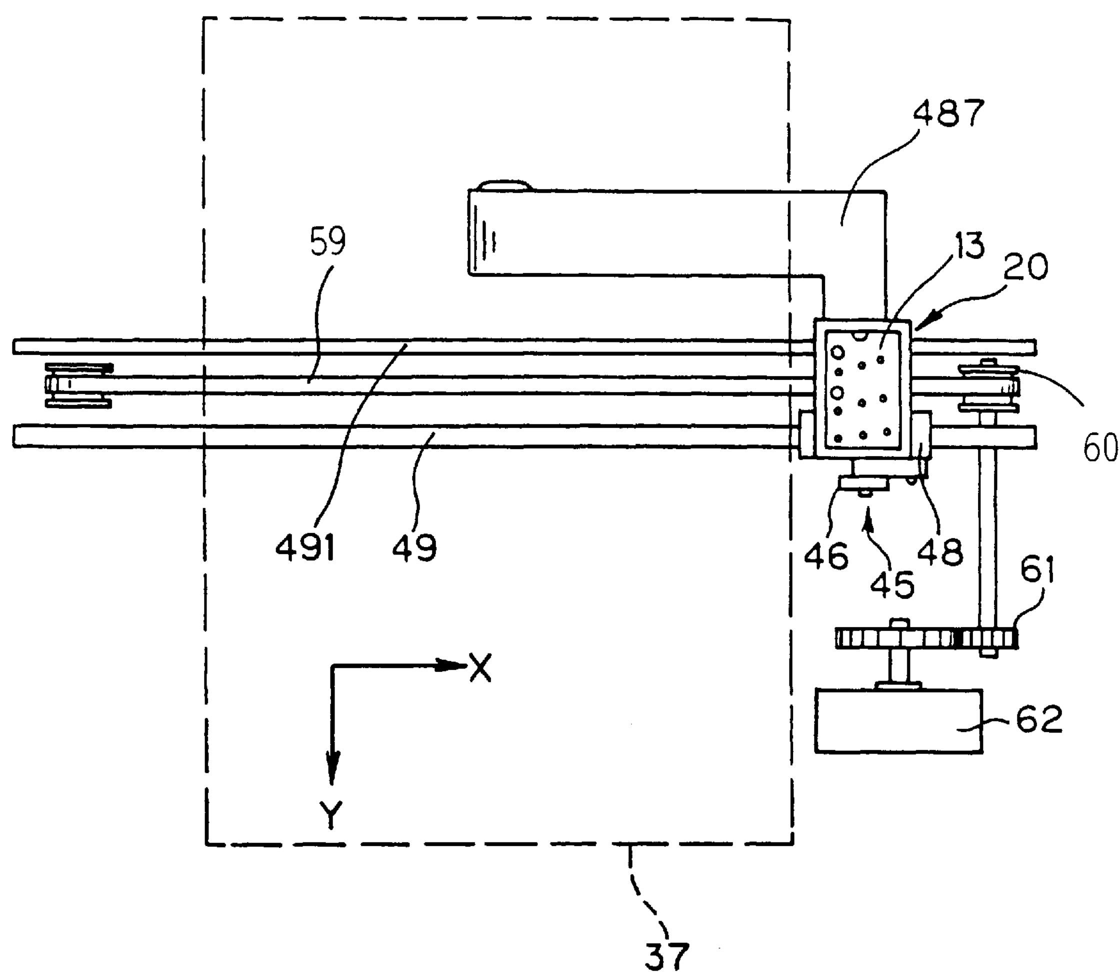
FIG. 2 is a bottom plan view of a main portion of the printer according to the embodiment of the present invention.

FIG. 1 is a schematic sectional side view showing a printer 80 of a photosensitive and pressure sensitive type, as preferable embodiment of an image forming apparatus of the present invention. FIG. 2 is a bottom view showing a main part of the printer 80.

As shown in FIG. 1, a cartridge 67 is detachably mounted on a case 81 of the printer 80. Microcapsule papers 37, which is one example of a photosensitive record medium, are stacked in the cartridge 67. In addition, each microcapsule paper 37 is stacked in such a condition that its light transmitting layer 31 is turned upside.

Each of the microcapsule papers 37 stacked in the cartridge 67 is taken out one by one by a feeding roller 65 shaped like a semicircular, and is transported toward an exposing mount 66 by sending rollers 68. The microcapsule paper 37 is moved to the right side in FIG. 1.

The exposing mount 66 is installed in the case 81. Further, the exposing mount 66 is supported by the springs 63, and is pressed up to an exposure head 20 by them such that its surface abuts the exposure head 20. Furthermore, the guide portion 661 is integrally formed at a left side edge of the exposing mount 66. The guide portion 661 gradually curves to the downside, as shown in FIG. 1. The microcapsule paper 37 transported by the sending rollers 68 is guided by the guide portion 661, and enters between the exposing mount 66 and the exposure head 20 by moving down the exposing mount 66 against pressure of springs 63.

Further, a preheater **64*a* is installed on the surface of the exposing mount 66, with which the microcapsule paper 37 is in contact. The preheater 64*a* is shaped like a film, and is used for heating the microcapsule paper 37 to a predetermined temperature in order to improve photosensitivity of the microcapsule paper 37 at the time of exposure. Further, the preheater 64*a*** is formed by printing a conductive heater on a membrane made by polyimide, and performs by supplying current to the conductive heater.

The exposure head 20 has a plurality of light emitting diodes (LEDs) emitting red light, a plurality of LEDs emitting green light and a plurality of LEDs emitting blue light. Hereinbelow, the LED emitting red light is referred to as a "Red LED", the LED emitting green light is referred to as a "Green LED", and the LED emitting blue light is referred to as a "Blue LED". Further, the exposure head 20 is mounted under a carriage 48, and is moved along a guide shaft 49 together with the carriage 48.

The carriage 48 is supported by the guide shaft 49 installed in the case 81, and can move along the guide shaft 49. The guide shaft 49 is a shaft whose sectional shape is circular, and it extends along the direction perpendicular to the transport direction of the microcapsule paper 37. Further, a shaft 481 is mounted on the left side (paper insertion side) of the carriage 48. The shaft 481 extends along the direction perpendicular to the guide shaft 49. At the tip of the shaft 481, a supporting roller 482 is mounted, and a supporting roller 482 rotates around the shaft 481. Further, in the case 81, a supporting shaft 491 is installed. The supporting shaft 491 extends along the direction parallel to the guide shaft 49. The supporting roller 482 is positioned on the supporting shaft 491, and supporting roller 482 is rolled on the supporting shaft 491 when the carriage 48 moves along the guide shaft 49. As shown in FIG. 2, the timing belt 59 is installed on the carriage 48. The timing belt is moved by a carriage motor 62 through a pulley 60 and a gear 61. Therefore, the carriage 48 is moved together with the timing belt 59 in the direction shown by an arrow X in FIG. 2.

As mentioned above, the carriage 48 is moved over the microcapsule paper 37 in the direction shown by the arrow X in FIG. 2 by the carriage motor 62, while the microcapsule paper 37 is transported below the carriage 48 in the direction shown by an arrow Y in FIG. 2 by the sending rollers 68. At this time, the LEDs installed on the exposure head 20 emit the lights onto the surface of the microcapsule paper 37. Therefore, the microcapsule paper 37 is exposed in two dimension. In addition, the microcapsule paper 37 may be exposed in two dimension by transporting the microcapsule paper 37 in the X and Y direction.

In this manner, the microcapsule paper 37 is exposed, and the latent images corresponding to red image, green image and blue image are formed on the microcapsule paper 37.

On the other hand, at the right side (paper discharge side) of the carriage 48, the development device 45 is installed. The development device 45 has a pressure roller 46, a bearing 51, an arm 483 and arm supporting shaft 481. Namely, an arm supporting shaft 481 is mounted on the right side. The arm supporting shaft 481 extends along the direction perpendicular to the guide shaft 49. Further, one side (right side in FIG. 3) of the arm 483 is connected to the tip of the arm supporting shaft 481. The arm 483 can rotate around the arm supporting shaft 481, and therefore, other side (left side in FIG. 3) of the arm 483 can move in the vertical direction. Further, on the other side of the arm 483, the pressure roller 46 is mounted. More specifically, on the other side of the arm 483, bearing supporting shaft 482 is mounted, and an inner ring of a bearing 51, such as a ball bearing, is fixed around the bearing supporting shaft 482, and the pressure roller 46 is press-fitted around an outer ring of a bearing 51. Therefore, the pressure roller 46 can be roll on the microcapsule paper 37 in the direction perpendicular to the transport direction of the microcapsule paper 37 when the carriage 48 is moved along the guide shaft 49.

The pressure roller 46 is formed like a ring whose sectional shape is a semicircle, as shown in FIG. 1. Therefore, only one point of the edge of an outer circumference of the pressure roller 46 contacts the surface of the microcapsule paper 37.

Figure 3:
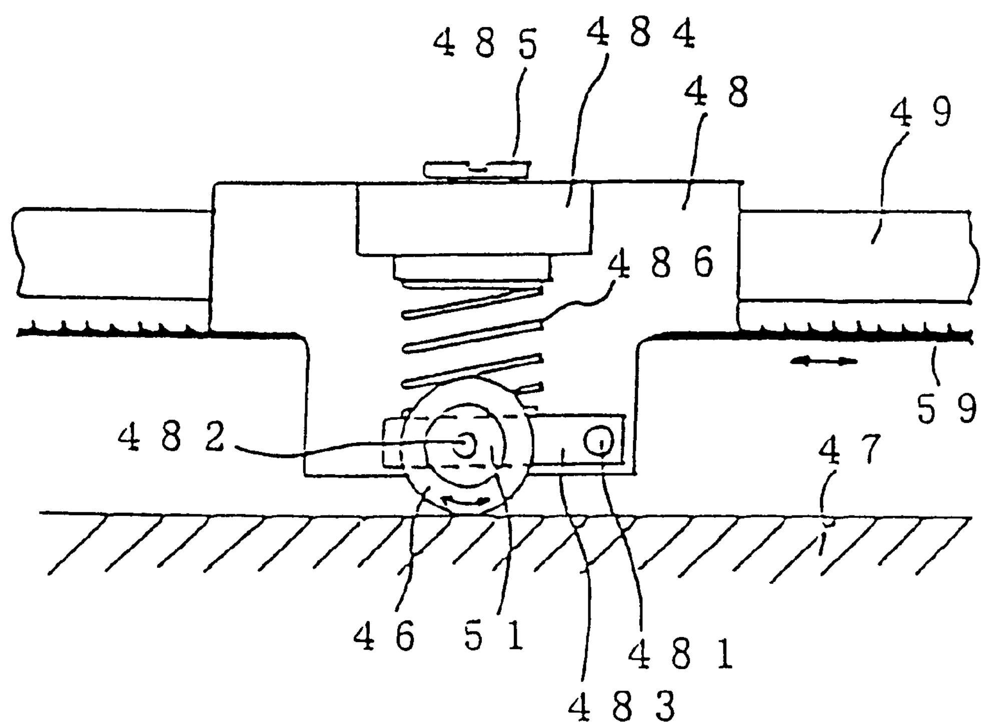
FIG. 3 is a front view of a development device to be used for developing a microcapsule paper according to the embodiment of the present invention.

On the other hand, as shown in FIGS. 1 and 3, at the top side of the carriage 48, the spring supporting portion 484 protrudes from the right side of the carriage 48. Further, an adjustment screw 485 is mounted on the spring supporting portion 484, and the spring 486 is mounted between the adjustment screw 485 and the arm 483. Therefore, the pressure roller 46 is pushed down onto a surface of a base mount 47 by the spring 486. Further, the strength of the pressure of the spring 486 can be adjusted by the adjustment screw 485. In addition, when the pressure of the spring 486 works on the base mount 47, its repulsion works on the carriage 48. Therefore, if there is no construction to support the carriage 48, the carriage 48 may be lifted by the repulsion. However, in the printer 80, the carriage 48 is supported by the guide shaft 49, the supporting shaft 491 and the supporting roller 492. Therefore, the carriage 48 is not lifted.

In development operation, the microcapsule paper 37 enters between the base mount 47 and the pressure roller 46. Then, when the carriage motor 62 is driven and the timing belt 59 is moved, the carriage 48 is moved along the guide shaft 49 in the direction perpendicular to the transport direction of the microcapsule paper 37. Therefore, the pressure roller 46 is rolled on the surface of the microcapsule paper 37, the pressure point of the pressure roller 46 is changed with the movement of the carriage 48. In this manner, one line of the microcapsule paper 37 is developed by the pressure applied from the pressure roller 46. After one line of the microcapsule paper 37 is developed by the movement of the carriage 48, the sending rollers 68 is rotated by a predetermined degree, and the microcapsule paper 37 is transported by a distance corresponding to one line or a distance corresponding to integer times as long as the one line. Thereafter, one line of the microcapsule paper 37 is developed again by movement of the carriage 48. Such an operation is repeatedly done, and the whole development area of the micrecapsule paper 37 is developed.

When the microcapsule paper 37 is pressed by the pressure roller 46, the microcapsule positioned at the pressure point is ruptured, and contents of the microcapusle, such as dye precursor flows out, and it reacts with developer. Therefore, coloring reaction occurs in the microcapusule paper 37. Further, the pressure point is moved according to the movement of the carriage 48 and the transport of the microcapsule paper 37. Therefore, a visible color image is formed in the development area of the microcapsule paper 37.

In the case 81 of the printer 80, a postheater 64*b* is installed at the right side (paper discharge side) of the development device 45. After the development, the postheater 64*b* heats the microcapsule paper 37 to about 60 to 80° C. Thereby, the microcapsule is perfectly cured, and dye precursor is perfectly confined within the microcapsule. Thus, the color image is completely formed. In addition, the postheater 64*b* is the same in construction as the preheater 64*a*. Further, discharge rollers 75 is installed at the right side of the post heater 64*b*. The microcapsule paper 37 is sent out of the printer 80 by the discharge rollers 75.

In addition, the case 81 performs as a shading cover to keep dark at the inside of the printer 80. Therefore, the microcapsule paper 37 taken out from the cartridge 67 and transported into the inside of the printer 80 is not exposed except for the parts exposed by the exposure head 20. Further, the case cover 82*a* is mounted on the case 81. As shown in FIG. 1, the case cover 82*a* is rotated around the axis d. Therefore, if the microcapsule paper 37 is jammed in the case 81, the case cover 82 can be opened, and the jammed microcapsule paper 37 can be removed.

Figure 4:
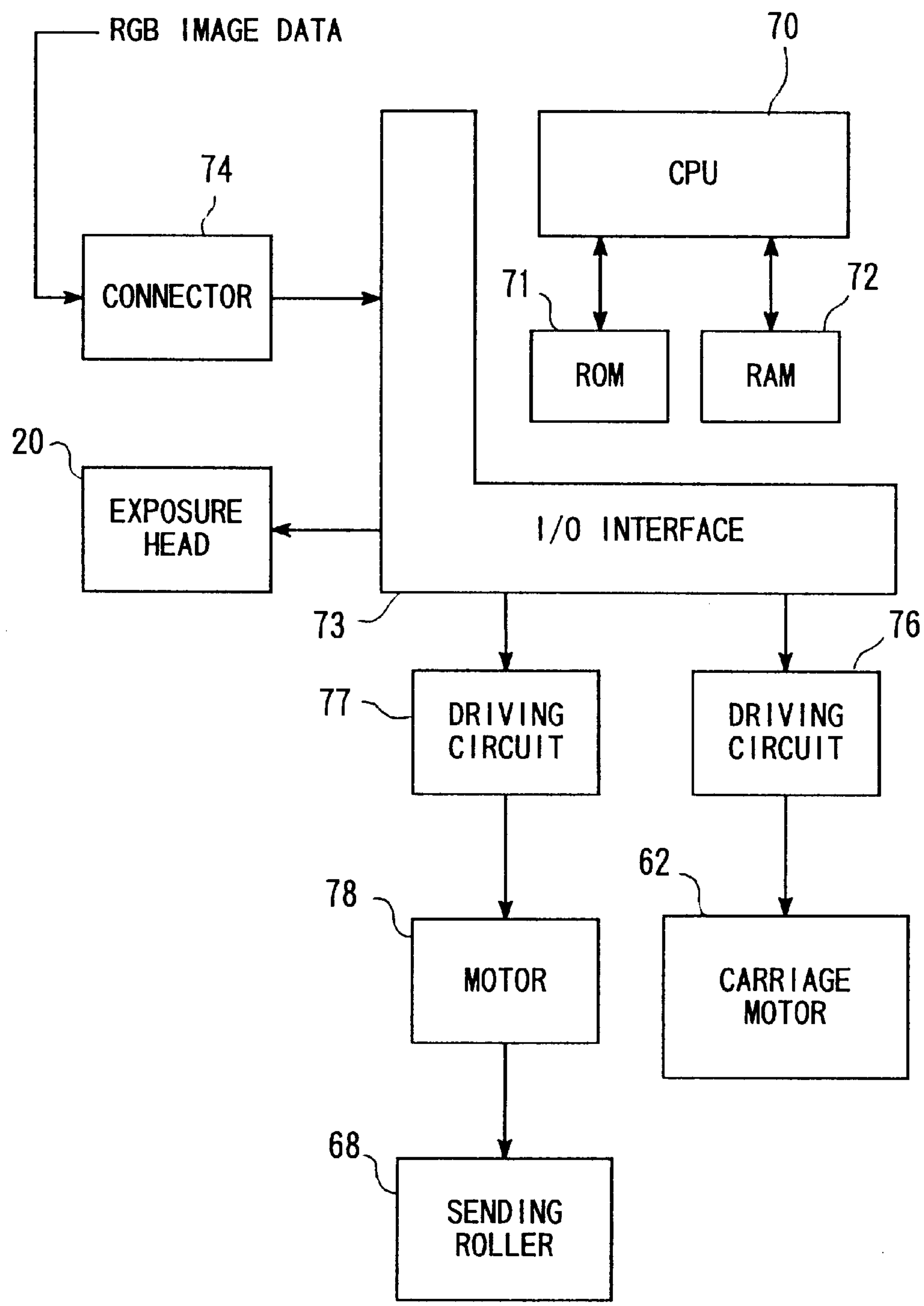
FIG. 4 is a block diagram showing an electrical configuration of the printer according to the embodiment of the present invention.

Next, the electrical construction of the printer 80 will be explained. FIG. 4 shows a configuration of a control circuit of the printer 80.

In FIG. 4, the control circuit of the printer 80 has a CPU 70, ROM 71 and RAM 72. The CPU 70 is connected with a connector 74 through the I/O interface 73. The CPU 70 receives RGB image data from an external host computer. Further, the CPU 70 is connected with: a driving circuit (not shown in Figure) to control each LED installed in the exposure head 20; a driving circuit 77 to drive a motor 78 to rotate the sending rollers 68; and a driving circuit 76 to drive a carriage motor 62.

In the ROM 71, various programs are stored. For example, a program to control a whole operation of the printer 80, a program to calculate emission periods and emission timings of each LED installed in the exposure head 20 on the basis of the received RGB image data, a program to control the sending rollers 68 and the discharge rollers 75 on the basis of the order of RGB exposure, a program to control the transport of the microcapsule paper 37, a program to control the carriage motor 62 on the basis of the order of the RGB exposure, etc are stored in the ROM 71. The CPU 70 performs according to these programs. Further, the RAM 72 is a temporary buffer in which data inputted from the external are temporarily stored. Namely, when the RGB image data are inputted in the printer 80, the inputted RGB image data are stored into the RAM 72.

Further, the LEDs installed in the exposure head 20 are controlled by the driving circuit, and the LEDs emit the lights on the basis of the RGB image data. In addition, the LEDs are connected to the driving circuit by a flexible harness 487.

Figure 5:
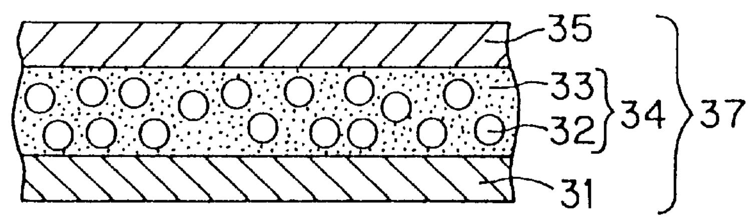
FIG.5 is a diagrammatically sectional view of the microcapsule paper to be used for the printer according to the embodiment of the present invention.

Next, the construction of the microcapsule paper 37 will be explained with reference to FIG. 5. FIG. 5 shows the sectional structure of the microcapsule paper 37.

In FIG. 5, the microcapsule paper 37 has a light transmitting layer 31, a coloring layer 34 and a supporting layer 35.

The coloring layer 34 is formed on the surface of the light transmitting layer 31. The coloring layer 34 contains microcapsules 32 and developer 33 (co-reactor). The microcapsule 32 contains: contents which creates color by reacting with developer 33, such as dye precursor, chromogenic material or the like; contents whose mechanical strength is changed by irradiation of light having a predetermined wavelength, such as photo-curing resin, photosensitive composition or the like; and polymerization initiator. The developer 33 contained in the coloring layer 34 together with the microcapsule 32 reacts with the dye precursor contained in the microcapsule 32. On the coloring layer 34, the supporting layer 35 is formed.

More specifically, there are three different microcapsules 32 in the coloring layer 34. A first microcapsule 32 contains colorless dye precursor, photo-curing resin and polymerization initiator. The dye precursor contained in the first microcapsule 32 colors yellow when it reacts with developer 33, and the photo-curing resin contained in the first microcapsules 32 cures when it is irradiated by a light having a wavelength corresponding to one color among three primary colors. A second microcapsule 32 also contains colorless dye precursor, photo-curing resin and polymerization initiator. The dye precursor contained in the second microcapsule 32 colors magenta when it reacts with developer 33, and the photo-curing resin contained in the second microcapsules 32 cures when it is irradiated by a light having a wavelength corresponding to another color among the three primary colors. A third microcapsule 32 also contains colorless dye precursor, photo-curing resin and polymerization initiator. The dye precursor contained in the third microcapsule 32 colors cyan when it reacts with developer 33, and the photo-curing resin contained in the third microcapsule 32 cures when it is irradiated by a light having a wavelength corresponding to the other color among the three primary colors.

For example, if the microcapsule paper 37 is exposed by being emitted by a blue light, whose wavelength is about 470 [nm], only microcapsule 32 containing dye precursor of yellow is cured. Therefore, when the pressure is applied to the microcapsule paper 37, the microcapsule 32 containing dye precursor of yellow is not ruptured, but the microcapsule 32 containing dye precursor of magenta and the microcapsule 32 containing dye precursor of cyan are ruptured respectively. Therefore, dye precursor of magenta and dye precursor of cyan are discharged from each of the ruptured microcapsules 32, and each dye precursor reacts with developer 33. Thereby, each dye precursor are colored, so that magenta and cyan are mixed and blue appears. Thus, a blue image is observed on the microcapsule paper 37 through the light transmitting layer 31.

Further, if the microcapsule paper 37 is exposed by being emitted by a green light, whose wavelength is about 525 [nm], only microcapsule 32 containing dye precursor of magenta is cured. Therefore, when the pressure is applied to the microcapsule paper 37, the microcapsule 32 containing dye precursor of yellow and the microcapsule 32 containing dye precursor of cyan are ruptured respectively. Therefore, dye precursor of yellow and dye precursor of cyan react with developer 33 and color respectively, so that yellow and cyan are mixed and green appears on the microcapsule paper 37.

Furthermore, if the microcapsule paper 37 is exposed by being emitted by a red light, whose wavelength is about 650 [nm], only microcapsule 32 containing dye precursor of cyan is cured. Therefore, when the pressure is applied to the microcapsule paper 37, the microcapsule 32 containing dye precursor of yellow and the microcapsule 32 containing dye precursor of magenta are ruptured respectively. Therefore, dye precursor of yellow and dye precursor of magenta react with developer 33 and color respectively, so that yellow and magenta are mixed and red appears on the microcapsule paper 37.

Moreover, when all of the microcapsules 32 are cured by the exposure, all of the microcapsules 32 are not ruptured if pressure is applied to them. Thereby, coloring is not performed, and images are not formed on the microcapsule paper 37. In this manner, on the microcapsule paper 37, color images are formed in only areas where coloring reaction is occurred, and in other areas, a color of the supporting layer 35 is visible through the light transmitting layer 31 and the coloring layer 34. Therefore, in case that the supporting layer 35 is white, a background color of the microcapsule paper 37 is white. In addition, such a coloring principle is referred to as "self-coloring", and the surface of the light transmitting layer 31 of the microcapsule paper 37 is referred to as a "coloring surface".

A material of the light transmitting layer 31 is a resin film, such as PET (polyethylene terephthalate), polyvinyl chloride or the like. Further, a sensitivity of the microcapsules paper 37 is changed with humidity. Therefore, a humidity-resistance material is used as a material of the light transmitting layer 31 and the supporting layer 35. Further, it is preferable to coat a humidity-resistance material on an external surface or an inner surface of the light transmitting layer 31 and the supporting layer 35. As the humidity-resistance material, an optical lens material, such as amorphous polyolefine, is preferably used. Further, as another method of forming a humidity-resistance membrane, an evaporation of $SiO_2$ or the like is preferable.

Further, a material having a characteristic that transmittance of ultraviolet is low is used as a material of the light transmitting layer 31 in order to prevent ultraviolet from transmitting through the light transmitting layer 31. Therefore, it can be prevented that color of the microcapusule is changed into yellow by ultraviolet, thereby, it can be prevented that chromaticity and density of background (blank) of the microcapsule paper 37 is changed.

A material of the dye precursor is triphenylmethane group or spiro-pyran group dye. A material of the photo-curing resin is acryloyl compound, such as trimethylolpropane triacrylate. A material of the polymerization initiator is a photochemical polymerization initiator, such as benzophenone, benzoyl alkyl ether or the like. A material of an envelope of the microcapsule is polymer, such as gelatin, polyamide, polyvinyl alcohol, isocyanate resin or the like.

A material of the developer (co-reactor) 33 is decided in accordance with a relation to composition of the dye precursor contained in the microcapsule 32. More concretely, a material of the developer 33 is acid, for example inorganic oxides, such as acid terra able, kaolin, acid zinc, titanium oxide or the like, pheno novolak resin, organic acid, or the like.

Further, binder, filler, viscosity control agent and so on may be added to the microcapsule 32 and developer 33. As shown in FIG. 5, the coloring layer 34 is formed on the light transmitting layer 31 by coating the aforementioned components on the light transmitting layer 31 by using a coating roller, a spray, a docter knife or the like.

The supporting layer 35 is a transparent, translucent or opaque supporter shaped like a sheet. A material of the supporting layer 35 is a paper(cellulose), a synthetic paper, a resin film, such as polyester, polycarbonate or the like. In addition, like the light transmitting layer 31, the supporting layer 35 is taken measures to protect the microcapsule 32 etc from humidity and ultraviolet.

Figure 6:
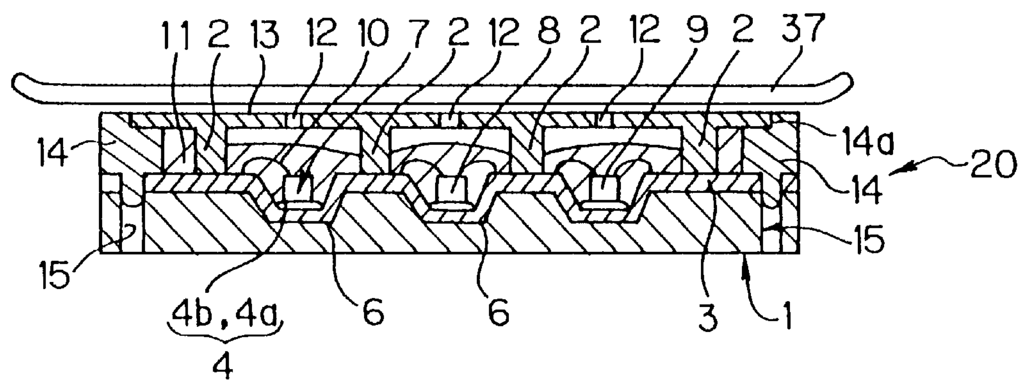
FIG. 6 is a diagrammatically sectional view of an exposure head installed in the printer according to the embodiment of the present invention.
Figure 7:
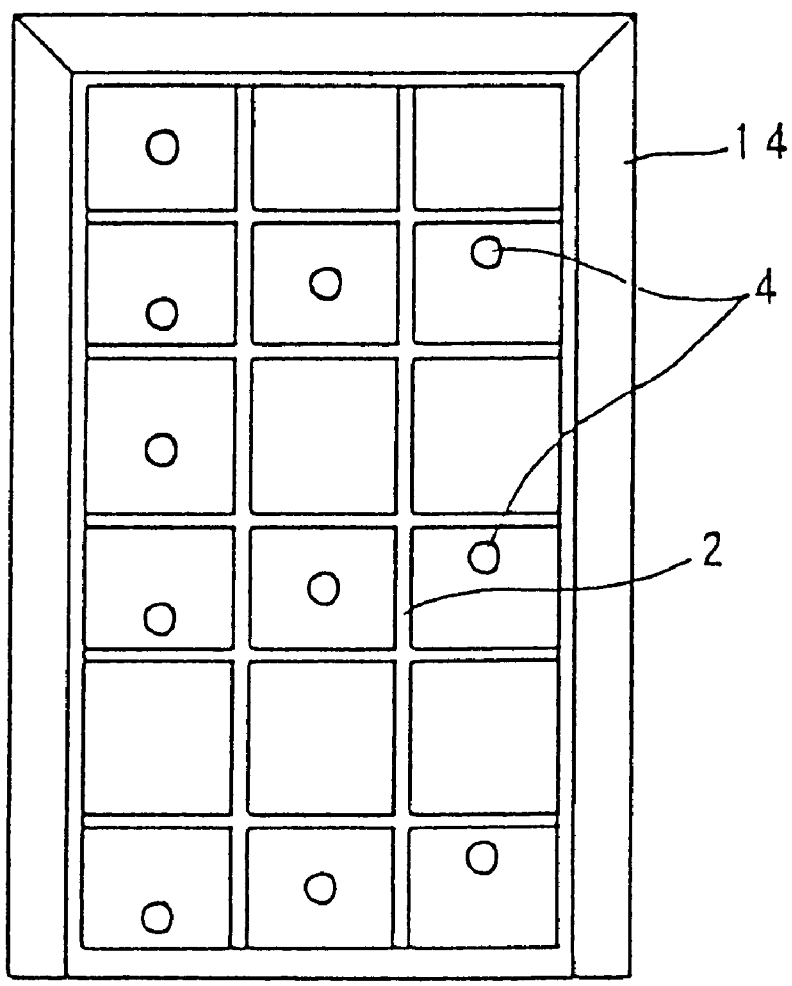
FIG. 7 is a top view of a mask holding member according to the embodiment of the present invention.
Figure 8:
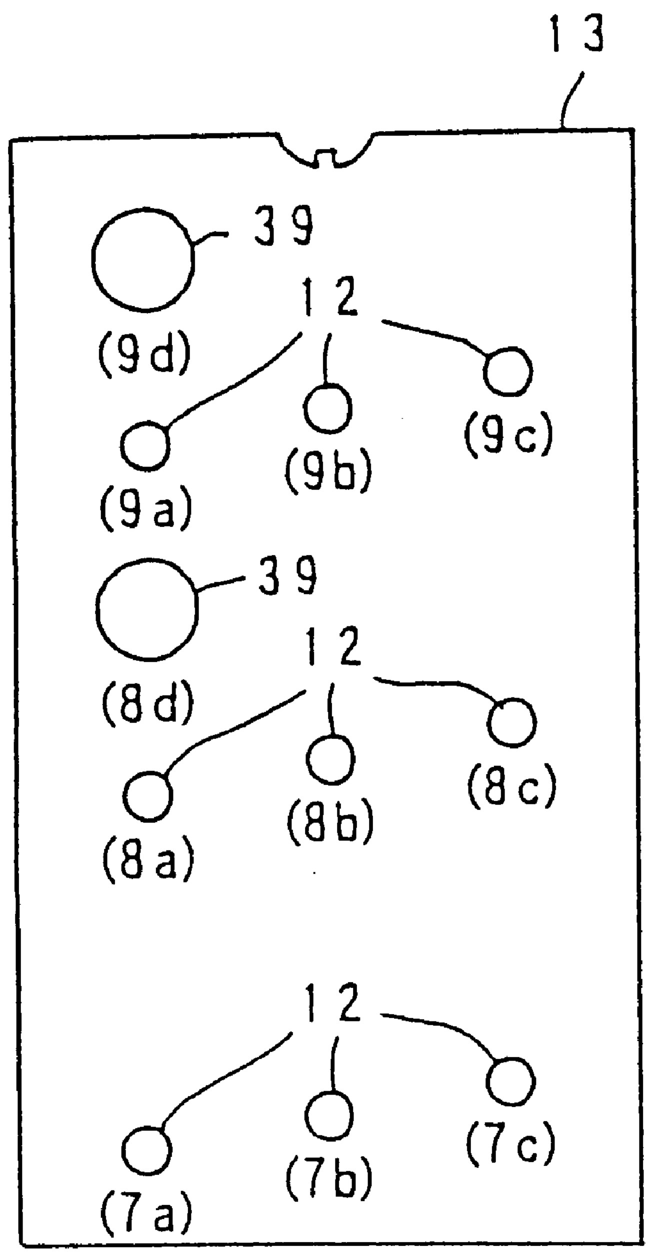
FIG. 8 is a top view of a mask according to the embodiment of the present invention.
Figure 9:
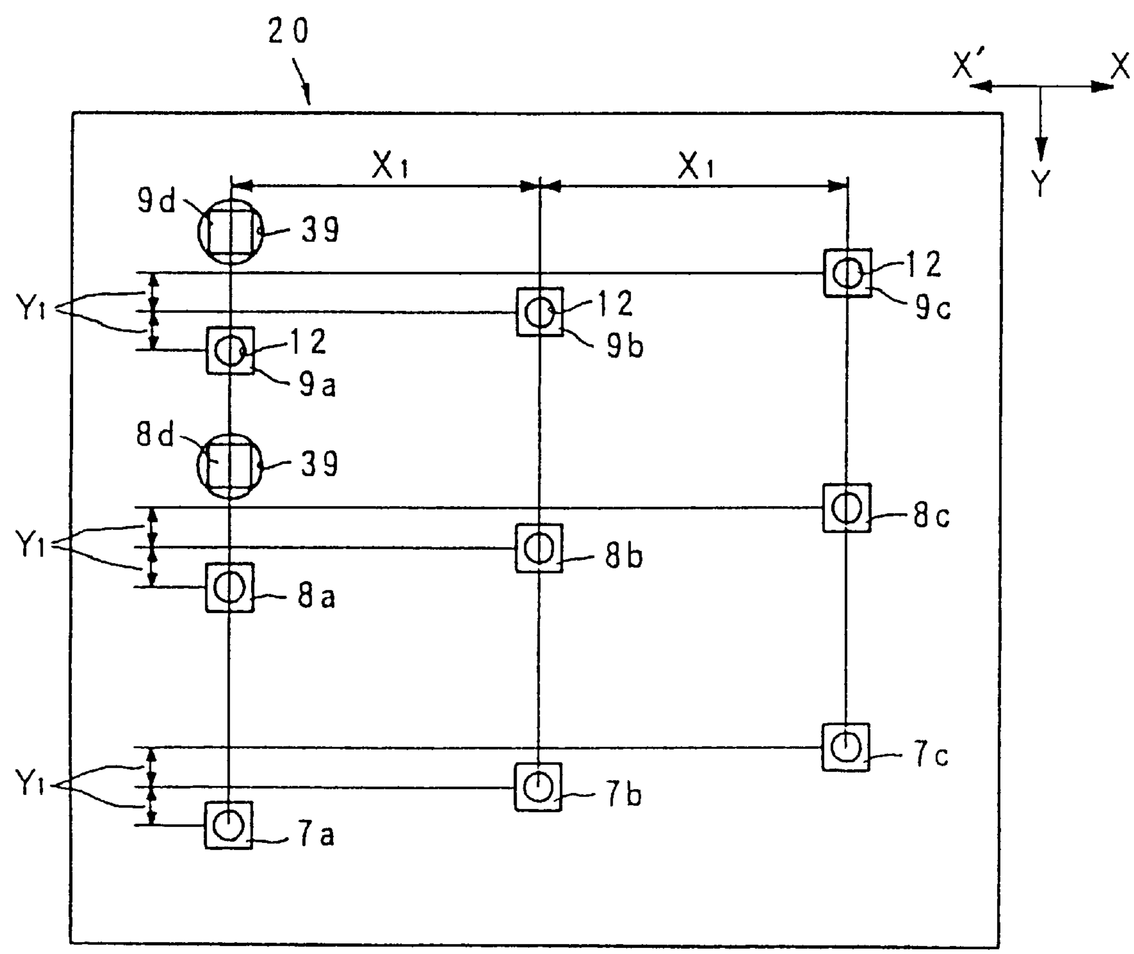
FIG. 9 is a diagram for explaining locations of LEDs on the exposure head according to the embodiment of the present invention.

Next, the construction of the exposure head 20 will be explained with reference to FIGS. 6 to 9. FIG. 6 is a schematic sectional view showing a main part of the exposure head 20, FIG. 7 is a top view showing a mask holding member 14, FIG. 8 is a top view showing a mask 13, and FIG. 9 is a plan view showing an arrangement of LEDs.

The exposure head 20 has a plurality of the LEDs 7, 8 and 9, a substrate 1 for holding the LEDs 7, 8 and 9, a mask 13 and mask holding member 14.

The substrate 1 is a flat plate made by glass epoxy. On the surface of the substrate 1, a plurality of depressions 4 are formed by cutting work or press work. Further, on the surface of the substrate 1, electrode layer 3 is formed by an electroless plating. The electrode layer 3 is a land pattern to transmit an electric signals. Further, a material of the electrode layer 3 is copper foil having a thickness of 35 [$\mu$m]. Further, bonding pads are formed on the electrode layer 3 at connecting points of bonding wires. The bonding pads are formed by laminating nickel having a thickness of 5 [$\mu$m] and gold having a thickness of 0.5 to 1.0 [$\mu$m] on the electrode layer 3. Namely, the bonding pads are three layer structure constructed by copper foil, nickel and gold. When the exposure head 20 is produced, at first, the depressions 4 are formed on the substrate 1 at predetermined locations, next, the electrode layer 3 is formed in a predetermined pattern, thereafter, the LEDs 7, 8 and 9 are mounted in the depressions 4 respectively, and these are adhered by silver paste or epoxy group adhesive.

Each of the depressions 4 is shaped like a "suribachi". Namely, a bottom face 4*a* of the depression 4 is parallel to the surface of the substrate 1. A side face 4*b* of the depression 4 is slanted. Therefore, an opening of the depression 4 expands upward. Further, the electrode layer 3 is formed along the surface of the substrate 1, the bottom faces 4*a* and the side faces 4*b* of the depressions 4.

Further, each of the Red LED 7, the Green LED 8 and the Blue LED 9 is mounted on the bottom face 4*a* of the depression 4, and it is fixed on the electrode layer 3 formed on the bottom face 4*a* by adhesive 6. Here, a depth of each of the depression 4 is deeper than a height of each of the LEDs 7, 8 and 9. Therefore, a position of the top portion of each LED is lower than the surface of the substrate 1. The top portion of each LED is connected to a predetermined position of the land pattern of the electrode layer 3 by a bonding wire 10. Further, each LED and the bonding wire 10 are sealed by a transparent sealing member 11 to shield them from air.

The adhesive to adhere the Red LED 7 to the bottom face 4*a*of the depression 4 is silver paste, and the adhesive to adhere each of the Green LED 8 and the Blue LED 9 to the bottom face 4*a* of the depression 4 is epoxy resin. A bottom face of the Red LED 7 performs as an electric terminal. Therefore, when the Red LED 7 is adhered on the electrode layer3 of the bottom face 4*a*, not only mechanical adhesion but also electrical connection is required. For this reason, silver paste is used as conductive adhesive in order to connect electrically the Red LED 7 with the electrode layer 3. On the other hand, in case of the Green LED 8 and the Blue LED 9, all of electric terminals are positioned top face thereof. Therefore, insulated and transparent epoxy resin is used as an adhesive to adhere each of the Green LED 8 and the Blue LED 9 to the bottom face 4*a* of the depression 4.

As mentioned above, the transparent adhesive is used to adhere each of the LEDs 8 and 9 to the bottom face 4*a* of depression 4. Thereby, when a light is generated at a inside of each LED 8, 9 and is emitted toward the bottom face 4*a* of the depression 4, the light is reflected in the bottom face 4*a* of the depression 4, and it is emitted from the top portion of each LED again. Therefore, the power of the light can be increased.

The basic material of the Red LED 7 is AlGaAs, and the Red LED 7 is constructed by DHH structure. The center wavelength of the Red LED 7 is about 650 [nm]. The Red LED 7 has two electric terminals. One electric terminal is positioned at the top portion of the Red LED 7, and the other is positioned at the bottom portion of the Red LED 7. On the other hand, the basic material of each of the Green LED 8 and the Blue LED 9 is GaN. The center wavelength of the Green LED 7 is about 525 [nm], and the center waveleghth of the Blue LED 9 is about 470 [nm]. Each of the Green LED 8 and the Blue LED 9 has two electrical terminals, and both of the electric terminals are positioned at the top portion of each LED. When current is supplied to the electric terminals of each of the LEDs 7, 8 and 9, each of the LEDs 7, 8 and 9 emits the light in all directions. At this time, the light emitted in the direction of the bottom face 4*a* is reflected in the bottom face 4*a*, so that the light is emitted in the upward direction in FIG. 6. Further, the light emitted in the direction of the side face 4*b* is reflected in the side face 4*b*, so that the light is emitted in the upward direction in FIG. 6. In this manner, the light emitted from each of the LEDs 7, 8 and 9 in all directions is collected by the depression 4, and is radiated in the upward direction of FIG. 6.

The bonding wire 10 is constructed by a gold wire, and connects the top portion of each LED with the bonding pad formed on the electrode layer 3. The bonding wire 10 is connected by heating or supersonic.

The sealing member 11 is formed by thermosetting resin. For example, transparent silicone resin or epoxy resin is generally used as a material of the sealing member 11. Cure temperature of the thermosetting resin used for the sealing member 11 is generally about 150 [° C.], and cure time thereof is about 4 hours. The sealing member 11 shields the LEDs 7, 8 and 9 from air in order to prevent a semiconducting materials i.e., the LEDs 7, 8 and 9 from reducing their properties by oxidation or moisture absorption. Further, the sealing member 11 protects the bonding wire 10 from an external force. Moreover, the sealing member 11 adheres the mask 13 and the mask holding 14 with the substrate 1 respectively.

The mask 13 having a plurality of pinholes 12 and 39 is mounted on the substrate 1 through the mask holding member 14. The mask holding member 14 is mounted in positioning holes 15 formed on the substrate 1. The mask 13 is mounted on positioning slot 14*a* formed on the top surface of the mask holding member 14, and the mask 13 is fixed on the mask holding member 14 by the adhesive or the like. Further, the mask 13 and the mask holding member 14 are integrally fixed on the substrate 1.

FIG. 7 is the top view of the mask holding member 14, and also shows the position of the depressions 4. As shown in FIG. 7, a separation wall 2 is integrally formed on the mask holding member 14 so as to separate a light transmission space between the mask 13 and the substrate 1 in correspondence with depressions 4 formed on the substrate 1. In this separation wall 2, as shown in FIG. 6, a bottom end surface thereof abuts on a top surface of a non-depressed area of the substrate 1 (including the top surface of the electrode layer 3), and a top end surface of the separation wall 2 abuts on a bottom end surface of the mask 13. By this separation wall 2, the light transmission space between the substrate 1 and the mask 13 is separated for each light emitting elements (LED). Therefore, a light flux emitted from each LED mounted in the depression 4 is emitted from only a pinhole 12 of a mask 13 corresponding to each depression 4 to an outside of the exposing head 20, due to an existence of the separation wall 2 surrounding each depression 4, and the light flux is not emitted from pinholes 12 corresponding to the other depressions 4. Since a stray light is not generated, it is possible to create an image with a high resolution.

The mask holding member 14 is a simply molding product and is made of a heat-proof plastic material. The mask holding member 14 is positioned on the substrate 1 by the positioning holes 15, and performs that the mask 13 is positioned in a three-axis direction. Further, the mask holding member 14 performs that the light transmission space between the substrate 1 and the mask 13 is separated for each LED by the separation wall 2 in order to prevent a stray light. Here, the stray light means a light emitted from the LED and outputted through adjacently non-corresponding pinholes 12. As mentioned above, the mask 13 and the mask holding member 14 are connected to the substrate 1 by the sealing member 11 made by thermosetting resin. Therefore, in order to prevent that the mask holding member 14 is deformed when temperature increases to the cure temperature of the sealing member 11, it is required to use a heat-proof material, such as POM or the like, as the mask holding member 14. The mask holding member 14 having the separation wall 2 is one example of an optically separating means. In addition, it is possible to implement the separation wall 2 separately from the mask holding member 14, and also possible to integrally implement on the substrate 1 side. Moreover, it is possible to integrate the separation wall 2 with the mask 13. Furthermore, it is possible to employ a quadrilateral as well as a round and other various shapes as the space shape to be separated.

FIG. 8 is a top view of the mask 13. The mask 13 is made of a stainless steel having a thickness of approximately 0.1 [mm]. An outer shape thereof and the pinholes 12, 39 are processed by an etching. A surface of the mask 13 is blackened by a dipping process in order to prevent a reflection of light. Namely, a non-reflective process is carried out for the mask 13. In addition, in case that the trouble of the stray light has been solved by the separation wall 2 of the mask holding layer 14, such a non-reflective process is unnecessary.

As shown in FIG. 9, a diameter of the pinhole 12 is set to approximately 0.2 to 0.18 [mm]. This hole diameter determines a resolution of a light pattern supplied to the microcapsule paper 37. The sub pinhole 39 having a hole diameter of 0.4 [mm] equal to two times the diameter of the pinhole 12 is a pinhole for a sub-emission. These pinholes 12, 39 are positioned each corresponding to respective one of the red LED 7, the green LED 8 and the blue LED 9.

As shown in FIG. 9, three Red LEDs 7*a*, 7*b* and 7*c* are located on the substrate 1 as a group of the Red LED, and three Green LEDs 8*a*, 8*b* and 8*c* are located on the substrate 1 as a group of the Green LED, and three Blue LEDs 9*a*, 9*b* and 9*c* are located on the substrate 1 as a group of the Blue LED. These LEDs are used for the exposure to form a latent image. The operations of ON or OFF of these LEDs are controlled according to the RGB image data. On the other hand, a Green LED 8*d* and a Blue LED 9*d* are light sources to be used for sub-emission. The sub-emission means an emission unrelated to form a latent image. Namely, these LEDs are not controlled according to the RGB image data. Here, with respect to green and blue, there is a range of energy density wherein density of an output image formed on the microcapsule paper 37 is not changed even if exposure is done, i.e., there is a range of energy density wherein the photo-curing resin contained in the microcapsule 32 is not cured even if a light is emitted to the microcapsule 32. For example, when the microcapsule paper 37 is exposed by ⅕ energy density as many as energy density required to change the density of an output image to maximum amount, the density of an output image formed on the microcapsule paper 37 is not changed. The lights having the ⅕ energy density are always emitted form the Blue LED 8*d* and the Green LED 9*d*, so that the number of the LEDs to be used for exposure can be reduced.

On the other hand, with respect to red, there is no LED to be used for the sub-emission. With respect to red, the range wherein density of an output image formed on the microcapsule paper 37 is not changed is very small. Concretely, if an energy density is exceeded 1/20 energy density as many as energy density required to change the density of an output image to maximum amount, the density of an output image formed on the microcapsule paper 37 is changed.

Further, the diameter of the pinhole 39 to be used for the sub-emission is about 0.4 [mm], and the diameter of the pinhole 12 to be used for the exposure to form a latent image is about 0.18 to 0.2 [mm]. Namely, an area of the pinhole 39 is four times as many as that of the pinhole 12. Therefore, a light energy passed through the pinhole 39 is also four times as many as that passed through the pinhole 12. Therefore, if a single LED to be used for the sub-emission is mounted on the exposure head 20, a large amount of energy density is obtained by this single LED, so that the number of the LEDs can be reduced, and the cost for LEDs can be reduced.

As shown in FIG. 9, a distance between the Red LED 7*a* and the Red LED 7*b* in the direction of the movement of the exposure head 20 (X direction) is X1. Similarly, a distance between the Red LED 7*b* and the Red LED 7*c* is also X1. The distance X1 is equal to an integer times (for example 16 times) as long as a distance between dots of an image formed on the microcapsule paper 37. On the other hand, a distance between the Red LED 7*a* and the Red LED 7*b* in the transport direction of the microcapsule paper 37 (Y direction) is Y1. Similarly, a distance between the Red LED 7*b* and the Red LED 7*c* is also Y1. The distance Y1 is equal to one dot of an image or an integer times as long as the one dot of the image.

Like the Red LEDs 7*a*, 7*b* and 7*c*, the Green LEDs 8*a*, 8*b* and 8*c* and the Blue LED 9*a*, 9*b* and 9*c* are located respectively. Namely, as shown in FIG. 9, each distance between adjacent LEDs in the X direction is X1, and each distance between adjacent LEDs in the Y direction is Y1. In addition, a distance between the Red LEDs group 7 and the Green LEDs group 8 in the Y direction is equal to 12 dots. Similarly, a distance between the Green LEDs group 8 and the Blue LEDs group 9 is equal to 12 dots.

More concretely, the Green LEDs group 8 includes three Green LEDs 8*a*, 8*b* and 8*c* spaced every 16 dots (X1=16 dots) in the direction of the movement of the exposure head 20 (X direction) and spaced every 1 dots (Y1=1 dot) in the transport direction of the microcapsule paper 37 (Y direction). Further, the Red LEDs group 7 is located at the position shifted forward 12 dots from the position of the Green LEDs group 8, and the Red LEDs group includes three Red LEDs 7*a*, 7*b* and 7*c* spaced every 16 dots (X1=16 dots) in the X direction and spaced every 1 dots (Y1=1 dot) in the Y direction. Furthermore, the Blue LEDs group 9 is located at the position shifted backward 12 dots from the position of the Green LEDs group 8, and the Blue LEDs group includes three Blue LEDs 9*a*, 9*b* and 9*c* spaced every 16 dots (X1=16 dots) in the X direction and spaced every 1 dots (Y1=1 dot) in the Y direction.

Here, In FIG. 9, Y2 is equal to 10 dots, and a distance between the Blue LED 9*a* and the Red LED 7*a* is equal to 24 dots. Namely, each distance between the LEDs groups is equal to an integer times as large as the number of the LEDs included in each LEDs group.

Further, the location of the pinholes 12 and 39 of the mask 13 are corresponded to the location of the LEDs.

As mentioned above, distances between the respective LED groups and development device 45 are different from one another. Namely, a distance between the Green LEDs group and the development device 45 is longer than a distance between the Red LEDs group and the development device 45. Further, a distance between the Blue LEDs group and the development device 45 is longer than the distance between the Green LEDs group and the development device 45. Namely, an LED emitting a light having the shortest wavelength is located at the farthest position from the development device 45.

Here, a rate (velocity) of polymerization reaction between polymerization initiator and photo-curing resin is not so fast. If a period between an end of exposure and a start of development becomes longer, the sensitivity of the micropapusule 32 is relatively increased.

Further, a required period until the sensitivity of the microcapsule reaches a predetermined sensitivity differs in accordance with a wavelength of a light emitted at the time of exposure. Namely, if the wavelength of the emitted light becomes shorter, a required period until the sensitivity of the microcapsule reaches a predetermined sensitivity becomes longer. A cause that the period between exposure and development differs according to the wavelength of the light is a difference of intensity of the polymerization initiator contained in the microcapusule. Namely, in a range of a long wavelength, a photon energy is small and thereby a reactivity of a photo-curing is bad. Therefore, in case of the microcapsule having the photo-curing resin cured by an irradiation of a light having a relatively long wavelength, a strong polymerization initiator, such as photo initiator, is added into it in order to improve its reactivity.

Figure 10:
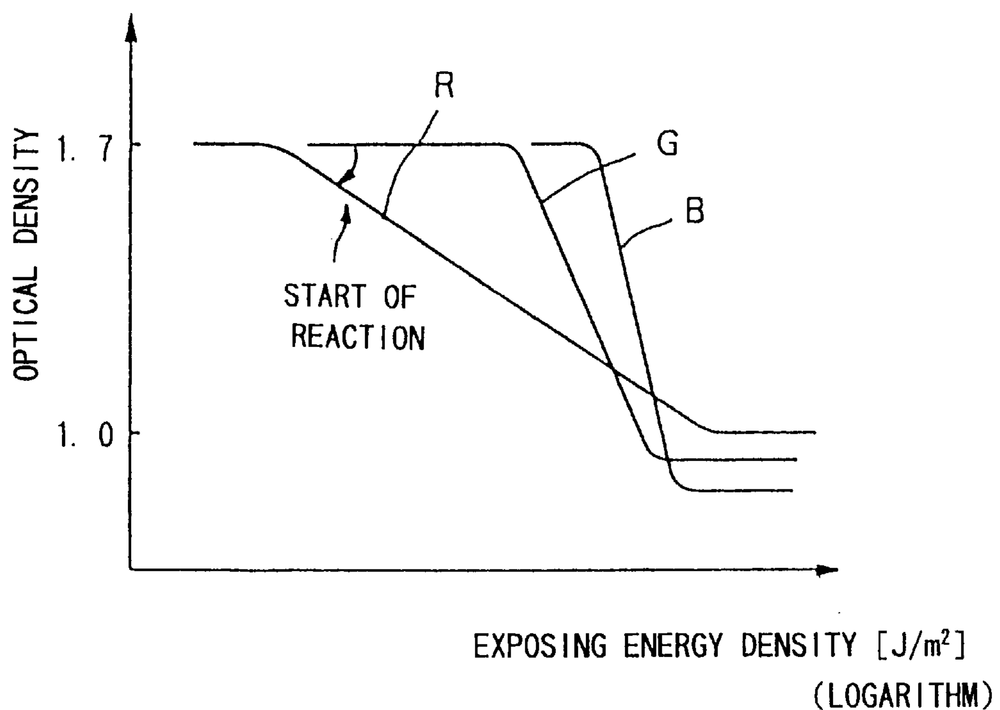
FIG.10 is a graph showing a relation between a coloring density (reflection density) and an exposing energy density of the microcapsule paper.
Figure 11:
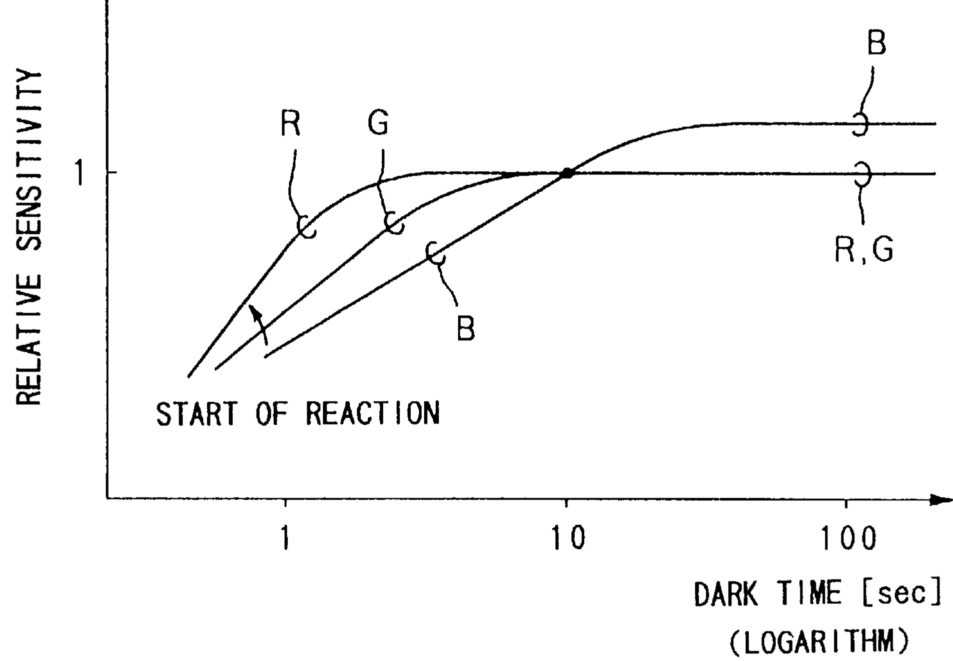
FIG. 11 is a graph showing a relation between a relative sensitivity and a dark time of the microcapsule in each color.

As a result, the reaction of the microcapusule having the photo-curing resin cured by the irradiation of the red light is better than any other microcapsules, as shown in FIG. 10. Further, the period between exposure and development of the microcapusule having the photo-curing resin cured by the irradiation of the red light is shorter than any other microcapsules, as shown in FIG. 11.

For this reason, the Red LEDs group 7 is located at the position nearest the development device 45, and the Blue LEDs group 9 is located at the position farthermost from the development device 45.

In such an arrangement of the LEDs, the period between an end of exposure and a start of development (it is referred to as a "dark time".) is different in each LEDs group. Namely, the dark time of the Blue LEDs group is 14 seconds, the dark time of the Green LEDs group is 9 seconds, and the dark time of the Red LEDs group is 4 second. Therefore, the relative sensitivity obtained by exposure is the same with respect to all LEDs groups, as shown in FIG. 11.

In addition, the number of the LEDs included in each of the Blue LEDs group, Green LEDs group and Red LEDs group is not restricted to three. If the distance between a location of an LED emitting a light having a relatively short wavelength and the development device 45 is extended, an exposing sensitivity can be increased. Thus, the number of the LED emitting light having a relatively short wavelength, whose manufacturing method is complicated and procurement is difficult, is relatively reduced, so that it is possible to reduce the cost.

The exposure head 20 having the above mentioned configuration is moved at a predetermined velocity V along a horizontal direction in FIG. 2 (X direction in FIG. 9), for example, in the +X direction while the LEDs are emitted in accordance with the RGB image data. After that, the microcapsule paper 37 is transported by a distance relative to one exposure line in a vertical direction in FIG. 2 (Y direction in FIG. 9). After that, the exposure head 20 is moved at the predetermined velocity in the −X direction while the LEDs are emitted in accordance with the RGB image data. After that, again, the microcapsule paper 37 is transported by the distance relative to the one exposure line in the Y direction. Then, the exposure head 20 is moved in the +X direction while the LEDs are emitted in accordance with the RGB image data. Namely, the above mentioned operations are repeated to expose the micocapsule paper 37 in accordance with the RGB image data. Namely, while the exposure head 20 and the microcapsule paper 37 are moved, each LED is emitted independently in accordance with RGB image data. Hence, it is possible to supply a light having a predetermined central wavelength to a predetermined position for a predetermined time at a predetermined light power. Therefore, a latent image for a color image can be formed on the micropcasule paper 37. When the LEDs are emitted in accordance with the RGB image data as mentioned above, the sub-emission LEDs, i.e., the Green LED 8*d* and the Blue LED 9*d* always emit the lights unrelated to the RGB image data. Thereby, all of the image forming area of the microcapsule paper 37 is irradiated by the Green LED 8*d* and the Blue LED 9*d*. Further, the dark time is different in each LEDs group, so that light density of coloring is the same with respect to all colors, and therefore, a quality of an image can be improved.

Figure 12:
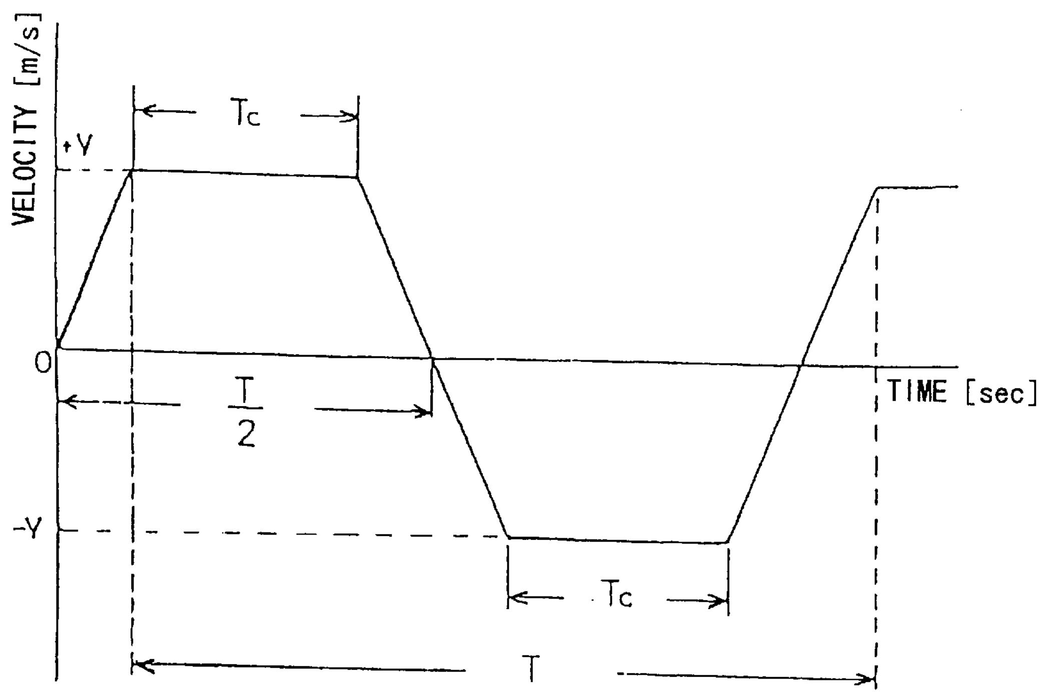
FIG. 12 is a graph showing a moving velocity of a carriage.

Next, the movement of the carriage 48 will be explained with reference to FIG. 12. FIG. 12 shows a change of movement velocity of the carriage 48.

The carriage 48 is moved at velocity according to a velocity changing pattern shown in FIG. 12 by the carriage motor 62. More concretely, a maximum velocity of the carriage 48 is "V" [m/sec], a movement cycle that the carriage 48 is moved in the +X direction and is moved in the −X direction continuously (see FIG. 2), i.e., a round trip cycle of the carriage 48, is "T" [sec], and the constant velocity time, which means a period that velocity of the carriage 48 is constant, is "Tc" [sec]. The constant velocity time Tc means a period required for the carriage 48 to be moved perfectly between an edge and the opposite edge of the microcapsule paper 37 in the X direction. Further, in the graph in FIG. 12, oblique part compared with the abscissa means an acceleration area or a reduction area between a temporary stop and the maximum velocity V of the carriage 48 when the carriage 48 reaches an end of its movement path.

Further, the emissions of the Red LEDs 7*a*, 7*b* and 7*c*, the Green LEDs 8*a*, 8*b* and 8*c*, and the Blue LEDs 9*a*, 9*b* and 9*c* are controlled in accordance with an RGB image data. Further, the emissions of these LEDs are controlled in consideration of a time required for the carriage 48 to move between the LEDs arranged in the X direction and a time required for the microcapsule paper 37 to transport between the LEDs arranged in the Y direction.

Here, an example of the exposing operation will be explained. The following explanation describes the exposing operation to make one pixel (1 dot) of the microcapsule paper 37 white in case of Y1=1, Y2=10, as shown in FIG. 9.

Figure 13:
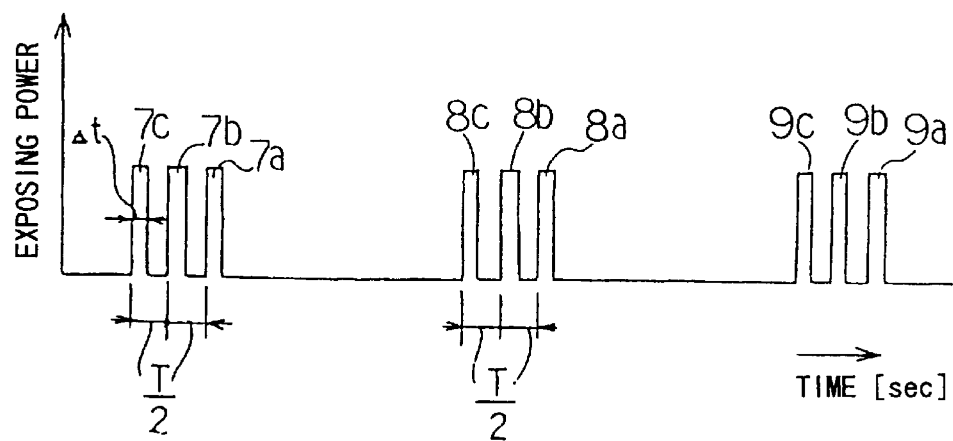
FIG. 13 is a view showing a timing chart of a plurality of light energies applied to one pixel.

Namely, at first, the carriage 48 is moved in the X direction in FIG. 9, and when a pinhole 12 opposite to the Blue LED 9*c* is located at the one pixel point, the Blue LED 9*c* is once turned on only for a predetermined short time Δt. After that, the carriage 48 is once stopped at one final end on an movement path. Next, the microcapsule paper 37 is transported by the distance relative to the one dot in the Y direction of FIG. 9. After that, the carriage 48 is moved in the −X direction in FIG. 9, and when a pinhole 12 opposite to a Blue LED 9*b* is located at the one pixel point, the Blue LED 9*b* is once turned on only for the predetermined short time Δt. Then, the carriage 48 is once stopped at the other final end on a movement path. Moreover, the microcapsule paper 37 is transported by the distance relative to the one dot in the Y direction of FIG. 9. After that, the carriage 48 is moved in the X direction in FIG. 9, and when a pinhole 12 opposite to a Blue LED 9*a* is located at the one pixel point, the Blue LED 9*a* is once turned on only for the predetermined short time Δt. After that, the carriage 48 is once stopped at the one final end on the movement path. Thus, as shown in FIG. 13, the Blue LEDs emit the lights to the noted one pixel point for short time Δt in an order of the Blue LEDs 9*c*, 9*b* and 9*a* for each half time of the movement cycle T.

And, next, after the microcapsule paper 37 is transported by a distance relative to 10 dots in the Y direction of FIG.9, the carriage 48 is moved in the −X direction in FIG. 9. Then, when a pinhole 12 opposite to a Green LED 8*c* is located at the noted one pixel point, the Green LED 8*c* is once turned on only for the predetermined short time Δt. Then, the carriage 48 is once stopped at the other end on the movement path. Next, the microcapsule paper 37 is transported by the distance relative to the one dot in the Y direction of FIG.9. After that, the carriage 48 is moved in the X direction. Then, when a pinhole 12 opposite to a Green LED 8*b* is located at the one pixel point, the Green LED 8*b* is once turned on only for the predetermined short time Δt. After that, the carriage 48 is once stopped at the one final end on the movement path. Moreover, the microcapsule paper 37 is transported by the distance relative to the one dot in the Y direction. After that, the carriage 48 is moved in the −X direction. Then, when a pinhole 12 opposite to the Green LED 8*a* is located at the one pixel point, the Green LED 8*a* is once turned on only for the predetermined short time Δt. Thereafter, the carriage 48 is once stopped at the other final end on the movement path.

Next, after the microcapsule paper 37 is transported by the distance relative to the 10 dots in the Y direction of FIG. 9, the Red LEDs are also repeated to be turned on and off in an order of the red LEDs 7*c*, 7*b* and 7*a* for each predetermined short time Δt, while the carriage 48 is reciprocated.

In the exposing operation according to the aforementioned example, when the exposing operation is being carried out, the sub exposing LEDs, i.e, the Blue LED 9*d* and the Green LED 8*d* always emit the lights, and light energies are always supplied on the microcpasule paper 37 during the exposure operation. The amount of each light energy is set to the degree to which the microcapsules 32 is not cured.

Accordingly, the light energy is the same with respect to all of the Blue LED 9*a* to 9*c*, the Green LED 8*a* to 8*c* and the Red LED 7*a* to 7*c*. Further, with respect to the Blue lights and the Green lights, the light energies supplied from the Blue LED 9*d* and the Green LED 8*d* are added. Furthermore, the appropriate dark time is set for each LEDs. Therefore, the degree of cure is the same in every color of the microcapsule 32. In case the aforementioned example, all of the microcapsules 32 are cured to maximum degree. Therefore, a pressure are applied to the microcapsules 32 at the time of development, all of the microcapsules 32 are not ruptured, and thereby, the coloring reaction is not occurred. Thus, a condition that the white color of the supporting layer 35 is visible through the light transmitting layer 31 and the coloring layer 34 is kept after the development and the noted one pixel of the microcapsule paper 37 becomes white.

Actually, when the microcapsule paper 37 is exposed in accordance with the RGB image data, the light energy emitted each of the Red LEDs 7*a* to 7*c*, the Green LEDs 8*a* to 8*c* and the Blue LEDs 9*a* to 9*c* are changed according to the RGB image data. Therefore, a latent image corresponding to the RGB image data is formed on the microcapsule paper 37.

In addition, as shown in FIG. 13, according to the printer 80 of the embodiment, a plurality of emissions are carried out at the same position (the same one pixel) of the microcapsule paper 37 under intervals at the time of exposure.

Figure 14:
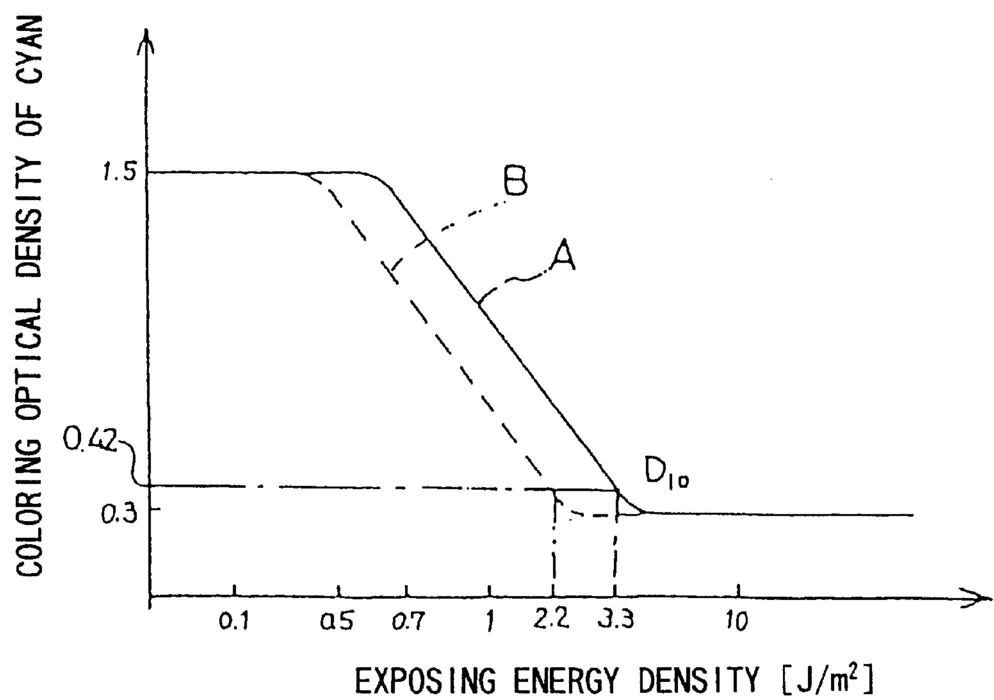
FIG. 14 is a graph explaining an effect of the plurality of exposures.

Namely, as exemplified in FIG. 14, an ordinate indicates a cyan coloring optical density, and a abscissa indicates a total amount of an exposing energy density [J/m$^2$]. In FIG. 14, a solid line A shows a change of the cyan coloring optical density when the light is emitted only one time from the Red LED. A dashed line B shows a change of the cyan coloring optical density when the light is emitted from the Red LED by dividing into three separate emissions, at a half interval of the movement cycle T.

In FIG. 14, in order to obtain a cyan coloring optical density of 10%, that is, D10=0.42, it is necessary to give an exposing energy density of 3.3 [J/m$^2$] if the single light emission. However, if the light is emitted by dividing into the three separate emissions as mentioned above, it is enough to give an exposing energy density of 2.2 [J/m$^2$] in total.

As can be understood from the comparison in FIG. 14, in a range of an exposing energy density [J/m$^2$] between 0.5 and 3.3, in order to obtain the same cyan coloring optical density, if the light is emitted by dividing into the three separate emissions, the exposing energy density may be small. However, if the light is emitted only one time, it is understood that a large exposing energy density is required.

A rate (velocity) of a polymerization reaction between the polymerization initiator and the photo-curing resin of the microcapsule 32 in the microcapsule paper 37 associated with the light emission is not so fast. The polymerization reaction is easily promoted if the exposing energy is applied little by little over a plurality of applications (for example, 2 to 6 applications) at suitable intervals rather than applying a large amount of the exposing energy all at once.

In short, even if an output of the LED servicing as one light emitting device is made smaller, or even if a mount number of the LEDs is small, a sufficient coloring optical density can be obtained.

It is desirable that the microcapsule paper 37 is entirely exposed and developed at a constant velocity. Further, it is desirable that the constant velocity time Tc is reduce to the degree that exposure and development of the microcapsule paper 37 are possible. For this reason, a movement distance L [m] at a constant velocity corresponding to the constant velocity time Tc must be selected at least over the range in which all pinholes 12 are passed. This movement distance L [m] at the constant velocity can be freely designed by a width of the microcapsule paper 37, the mount pattern of the pinhole 12 and the maximum velocity V [m/sec]. An example of values is L=0.118 [m] and V=0.86 [m/sec]. Accordingly, it is possible to expose and develop a whole surface of the microcapsule paper 37 with an A6 size.

In addition, the printer 80, which one example of the image forming apparatus of the present invention, is not to limited to the above mentioned embodiment. Then, various variations are possible.

Namely, the photosensitive record medium of the present invention is not limited to only the above mentioned microcapsule paper. Then, various variations are possible. As the microcapsule paper, a transcription type can be employed other than the above mentioned self-coloring type. A transparent material sheet for supporting a microcapsule, and a surface of a developer of an image receiving sheet supporting a developer for a surface of the microcapsule of the material sheet are overlapped with each other and are separably integrated with each other. Then, the material sheet is set to an exposure head side, and transported from a cartridge, and exposed and developed while maintaining its integrated state, and discharged from an apparatus, and then the image receiving sheet is separated. A dye precursor servicing as a colorant flowing out from the microcapsule that was pressed and ruptured is transcribed to the developer of the image receiving sheet, and reacts therewith and form a color to thereby actualize it.

Moreover, instead of the dye precursor, a pre-colored pigment or dye together with a photosensitive material can be contained in a microcapsule. In this case, an integration of an image receiving sheet having no developer (a typical paper) with the material sheet enables a transcription type of an image creation. This is because the image is actualized on the image receiving sheet by the separation.

A point contact ball, or a compression roller that performs a line contact can be employed as the pressure developing means, other than the pressure roller 46. Otherwise, it is possible to employ all implementations in which the microcapsule can be pressed and ruptured.

The light emitting device is not limited to only the LED. Various structures, such as an EL light emitting device, a plasma light emitting device, a laser light emitting device and the like, can be applied.

It is not necessary that the light emitting device is composed of the red, blue and green colors. Then, it can be selected from those having various wavelengths based on the sensitivity characteristic of the photosensitive record medium. For example, it may be selected as infrared, red and green, or as far infrared light, near infrared light and red. Also, ultraviolet light and far ultraviolet light are considered as an effective example of a selection for a color of the light emitting device.

Moreover, a number of the colors that the light emitting device has is not limited to the three red, green and blue colors. It may be one color or two colors. Furthermore, it may be four colors or more, such as a printer that uses yellow, magenta, cyan and black as a color former.

Further, in the above mentioned embodiment, the Red LEDs, the Green LEDs and the Blue LEDs are arranged in this order from the development device. The order of the LEDs is decided on the basis of the rate of the polymerization reaction, and the rate of the polymerization reaction is decided on the basis of an effect of the polymerization initiator contained in each microcapsule, as mentioned above. Therefore, if the effect of the polymerization initiator contained in each microcapsule is changed, it is required to change the order of the LEDs. In this case, it is impossible that the Red LEDs, the Blue LEDs and the Green LEDs are arranged in this order from the development device. Further, the Green LEDs, the Red LEDs and the Blue LEDs can be arranged in this order from the development device. Furthermore, the Green LEDs, or the Blue LEDs and the Red LEDs can be arranged in this order from the development device. Moreover, the Blue LEDs, the Red LEDs and the Green LEDs can be arranged in this order from the development device. Further, the Blue LEDs, the Green LEDs and the Red LEDs can be arranged in this order from the development device.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An image forming apparatus for forming an image on a photosensitive record medium by exposing and developing the photosensitive record medium, the photosensitive record medium having, at least, a first microcapsule including a first photosensitive component whose strength is changed by being emitted a first light having a first wavelength and a first coloring material, and a second microcapsule including a second photosensitive component whose strength is changed by being emitted a second light having a second wavelength and a second coloring material, the first wavelength being shorter than the second wavelength, the image forming apparatus comprising:

an exposing device on which at least a first light emitting device for emitting the first light and a second light emitting device for emitting the second light are mounted, for exposing the photosensitive record medium by the first light and the second light;

a developing device for developing the exposed photosensitive record medium by applying a pressure to the exposed photosensitive record medium; and a transporting unit for transporting the photosensitive record medium from an exposing position, where the exposing device is mounted, to a developing position, where the developing device is mounted, wherein, in the exposing device, the first light emitting device and the second light emitting device are arranged in a transport direction which the photosensitive record medium is transported by the transporting unit, the first light emitting device is positioned more distant from the developing position as compared with a position of the second light emitting device, and a distance between the first light emitting device and the second light emitting device corresponds to integer times as long as one pixel of the image.

2. An image forming apparatus according to claim 1, wherein the first light emitting device comprises a plurality of first light emitting elements each of which emits the first light and the second light emitting device comprises a plurality of second light emitting elements each of which emits the second light.

3. An image forming apparatus according to claim 2, wherein the first light emitting elements are arranged in a direction perpendicular to the transport direction of the photosensitive record medium, and the second light emitting elements are arranged in a direction perpendicular to the transport direction of the photosensitive record medium.

4. An image forming apparatus according to claim 1, wherein, on the exposing device, a mask, in which a plurality of pinholes positioned each corresponding to respective one of the first light emitting device and the second light emitting device are formed, is mounted in order to limit an irradiation area of each of the first light and the second light on the photosensitive record medium.

5. An image forming apparatus according to claim 1, wherein an emission of each of the first light emitting device and the second light emitting device is controlled on the basis of an image data inputted from an external.

6. An image forming apparatus according to claim 1, further comprising a moving means for moving the exposing device in a direction perpendicular to the transport direction of the photosensitive record medium.

7. An image forming apparatus for forming an image on a photosensitive record medium by exposing and developing the photosensitive record medium, the photosensitive record medium having, at least, a first microcapsule including a first photosensitive component whose strength is changed by being emitted a blue light and a first coloring material, a second microcapsule including a second photosensitive component whose strength is changed by being emitted a green light and a second coloring material, and a third microcapsule including a third photosensitive component whose strength is changed by being emitted a red light and a third coloring material, the image forming apparatus comprising:

an exposing device on which at least a first light emitting device for emitting the blue light, a second light emitting device for emitting the green light and a third light emitting device for emitting the red light are mounted, for exposing the photosensitive record medium by the blue light, the green light and the red light;

a developing device for developing the exposed photosensitive record medium by applying a pressure to the exposed photosensitive record medium; and a transporting unit for transporting the photosensitive record medium from an exposing position, where the exposing device is mounted, to a developing position, where the developing device is mounted, wherein, in the exposing device, the first light emitting device, the second light emitting device and the third light emitting device are arranged in a transport direction which the photosensitive record medium is transported by the transporting unit, the second light emitting device is positioned more distant from the developing position as compared with a position of the third light emitting device, the first light emitting device is positioned more distant from the developing position as compared with a position of the second light emitting device, and a distance between the first light emitting device and the second light emitting device corresponds to integer times as long as one pixel of the image.

8. An image forming apparatus according to claim 1, wherein the exposing device further has a third light emitting device for emitting a third light having a different color compared with respective the first light and second light.

9. An image forming apparatus according to claim 8, wherein the first light emitting device emits the first light having a blue color, the second light emitting device emits the second light having a red color, the third light emitting device emits the third light having a green color, and the third light emitting device is positioned near the developing position as compared with the position of the second light emitting device.

10. An image forming apparatus according to claim 8, wherein the first light emitting device emits the first light having a blue color, the second light emitting device emits the second light having a red color, the third light emitting device emits the third light having a green color, and the third light emitting device is positioned more distant from the developing position as compared with a position of the first light emitting device.

11. An image forming apparatus according to claim 8, wherein the first light emitting device emits the first light having a green color, the second light emitting device emits the second light having a red color, the third light emitting device emits the third light having a blue color, and the third light emitting device is positioned near the developing position as compared with a position of the second light emitting device.

12. An image forming apparatus according to claim 8, wherein the first light emitting device emits the first light having a blue color, the second light emitting device emits the second light having a green color, the third light emitting device emits the third light having a red color, and the third light emitting device is positioned more distant from the developing position as compared with a position of the first light emitting device.

13. An image forming apparatus for forming an image on a photosensitive record medium by exposing and developing the photosensitive record medium, the photosensitive record medium having, at least, a first microcapsule including a first photosensitive component whose strength is changed by being emitted a first light having a first wavelength and a first coloring material, and a second microcapsule including a second photosensitive component whose strength is changed by being emitted a second light having a second wavelength and a second coloring material, the first wavelength being shorter than the second wavelength, the image forming apparatus comprising:

an exposing means on which at least a first light emitting means for emitting the first light and a second light emitting means for emitting the second light are mounted, for exposing the photosensitive record medium by the first light and the second light;

a developing means for developing the exposed photosensitive record medium by applying a pressure to the exposed photosensitive record medium; and a transporting means for transporting the photosensitive record medium from an exposing position, where the exposing means is mounted, to a developing position, where the developing means is mounted, wherein, in the exposing means, the first light emitting means and the second light emitting means are arranged in a transport direction which the photosensitive record medium is transported by the transporting means, the first light emitting means is positioned more distant from the developing position as compared with a position of the second light emitting means, and a distance between the first light emitting means and the second light emitting means corresponds to integer times as long as one pixel of the image.

14. An image forming apparatus for forming an image on a photosensitive record medium by exposing and developing the photosensitive record medium, the photosensitive record medium having, at least, a first microcapsule including a first photosensitive component whose strength is changed by being emitted a blue light and a first coloring material, a second microcapsule including a second photosensitive component whose strength is changed by being emitted a green light and a second coloring material, and a third microcapsule including a third photosensitive component whose strength is changed by being emitted a red light and a third coloring material, the image forming apparatus comprising:

an exposing means on which at least a first light emitting means for emitting the blue light, a second light emitting means for emitting the green light and a third light emitting means for emitting the red light are mounted, for exposing the photosensitive record medium by the blue light, the green light and the red light;

a developing means for developing the exposed photosensitive record medium by applying a pressure to the exposed photosensitive record medium; and a transporting means for transporting the photosensitive record medium from an exposing position, where the exposing means is mounted, to a developing position, where the developing means is mounted, wherein, in the exposing means, the first light emitting means, the second light emitting means and the third light emitting means are arranged in a transport direction which the photosensitive record medium is transported by the transporting means, the second light emitting means is positioned more distant from the developing position as compared with a position of the third light emitting means, the first light emitting means is positioned more distant from the developing position as compared with a position of the second light emitting means, and a distance between the first light emitting means and the second light emitting means corresponds to integer times as long as one pixel of the image.

* * * * *